United States Patent
Wingrove et al.

(10) Patent No.: US 8,406,714 B2
(45) Date of Patent: Mar. 26, 2013

(54) METHOD OF DETERMINING STATION STATUS OF NON-AUDIBLE TUNER IN DUAL-TUNER SYSTEM

(75) Inventors: Theodore Charles Wingrove, Canton, MI (US); Anthony Ciatti, Ann Arbor, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 612 days.

(21) Appl. No.: 12/631,897

(22) Filed: Dec. 7, 2009

(65) Prior Publication Data

US 2011/0136454 A1 Jun. 9, 2011

(51) Int. Cl.
*H04B 1/18* (2006.01)
*H04K 3/00* (2006.01)

(52) U.S. Cl. .................................. 455/154.1; 455/191.1
(58) Field of Classification Search ..... 455/154.1–191.1
See application file for complete search history.

(56) References Cited

U.S. PATENT DOCUMENTS

| | | | |
|---|---|---|---|
| 6,021,320 A * | 2/2000 | Bickford et al. | ........... 455/186.1 |
| 6,961,550 B2 | 11/2005 | Ricard et al. | |
| 7,558,547 B2 | 7/2009 | Ricard et al. | |
| 7,565,122 B2 | 7/2009 | Eubanks | |
| 2008/0194217 A1 | 8/2008 | Eubanks | |
| 2008/0268802 A1 | 10/2008 | Ricard et al. | |
| 2009/0221248 A1 | 9/2009 | Ellis | |

* cited by examiner

*Primary Examiner* — Lee Nguyen
(74) *Attorney, Agent, or Firm* — Dickinson Wright PLLC

(57) ABSTRACT

A system and method of visually providing the current status of selected frequencies of particular interest to the user of an entertainment system and in particular, of a vehicle entertainment system.

27 Claims, 5 Drawing Sheets

METHOD OF DETERMINING STATION STATUS OF NON-AUDIBLE TUNER IN DUAL-TUNER SYSTEM

BACKGROUND OF THE INVENTION

1. Field of the Invention

The present invention is directed to a system and method of visually providing the current status of selected frequencies of particular interest to the user of an entertainment system and in particular, of a vehicle entertainment system.

2. Discussion

Consumers today have ever increasing choices for how to interact with the content provided through audio-visual entertainment systems including vehicle entertainment systems. Consumers of entertainment content increasingly demand the ability to quickly select and listen to only desirable content, which until now has been difficult to do with traditional radio receivers. The demand for easy and quick selection of desirable content can be traced to the proliferation of mass storage devices which allow consumers to store only desirable content and to quickly select which of that desirable content to listen to. In contrast, radio receivers in entertainment systems, in particular vehicle entertainment systems, allow no selection of content by the consumer except by the changing of frequencies to a different station.

Traditional radio receivers such as those found in vehicles were originally manually tuned and difficult to change between frequencies to different stations. As radio receivers added preset buttons and the ability of tuners to repeatably lock onto a particular station without additional adjustment by the user improved, and consumers could quickly change channels or frequencies between different stations or content sources. These quick changes improved the ability of consumers to change content sources but the consumer still was never able to predetermine before switching whether the content on a different station was more desirable than the existing channel or frequency. Even after radio receivers became digitized with digital tuners and digital displays, a user typically had to scan through multiple presets until content more desirable than the original content was found. For example, upon a start of a commercial from a first radio station, a user would select different presets associated with other favorite radio stations, which tuned the tuner to the stored preset frequency associated with the preset button. The user manually tunes the radio through multiple preset buttons until a radio station having more desirable content was found. The user had no knowledge of the status of the content on the other radio stations, such as if the other stations are playing music, or are also playing commercials.

Some manufacturers have added data signals that provide the user with information on the type of content provided on the station as well as information on the current song, but the user must be tuned to that station to determine the status of the current content. More specifically, no system or method exists that allows a user to easily and visually predetermine, with minimum distraction, the status of content being provided on other stations.

SUMMARY OF THE INVENTION

The present invention is directed to a system and method of visually providing the current status of selected frequencies of particular interest to the user of an entertainment system and in particular, of a vehicle entertainment system.

The vehicle entertainment system is capable of receiving a range of wireless frequencies and providing an audio output signal associated with a particular frequency selected from the range of wireless frequencies. The vehicle entertainment system includes an operator interface including a display and a plurality of preset buttons wherein each preset button is associated with a particular stored frequency selected from the range of wireless frequencies. The vehicle entertainment system also includes a first tuner providing the audio output signal associated with the particular frequency selected from the range of wireless frequencies, and a second tuner capable of scanning each of the particular stored frequencies associated with each of the plurality of preset buttons. The second tuner provides an output signal to a frequency analyzer and wherein the frequency analyzer provides a status signal to the operator interface related to the status of at least one of the particular stored frequencies and associated with at least one of the plurality of presets and wherein the operator interface provides a visual indicator associated with the at least one preset in response to the status signal.

Each of the preset button includes at least two backlight light sources, and wherein the at least two backlight light sources are the visual indicators. In addition, the backlight sources may emit a different light color, such as the at least two backlight sources include a first colored light source and a second colored light source and wherein the status signal includes a first status signal and a second status signal and wherein the first colored light source illuminates in response to the first signal and the second colored light source in response to the second signal.

The visual indicator may also be a symbol on the display in proximity to an associated preset button of the preset buttons. They symbol may also be colored for quick visual reference.

The present invention may also be directed to a method of determining the status of individual selected frequencies, each individual selected frequency being associated with a preset button of an entertainment system. The method steps include, providing an output signal from a first tuner; analyzing the individual selected frequencies with a second tuner; determining the status of each individual selected frequency analyzed during the step of analyzing the individual selected frequencies; providing a visual indicator output of the status of each individual selected frequency determined during the step of determining the status of each individual selected frequency.

BRIEF DESCRIPTION OF THE DRAWINGS

Other advantages of the present invention will be readily appreciated and more fully understood by reference to the following detailed description when considered in connection with the accompanying drawing wherein.

DETAILED DESCRIPTION OF THE INVENTION

Figure 1:
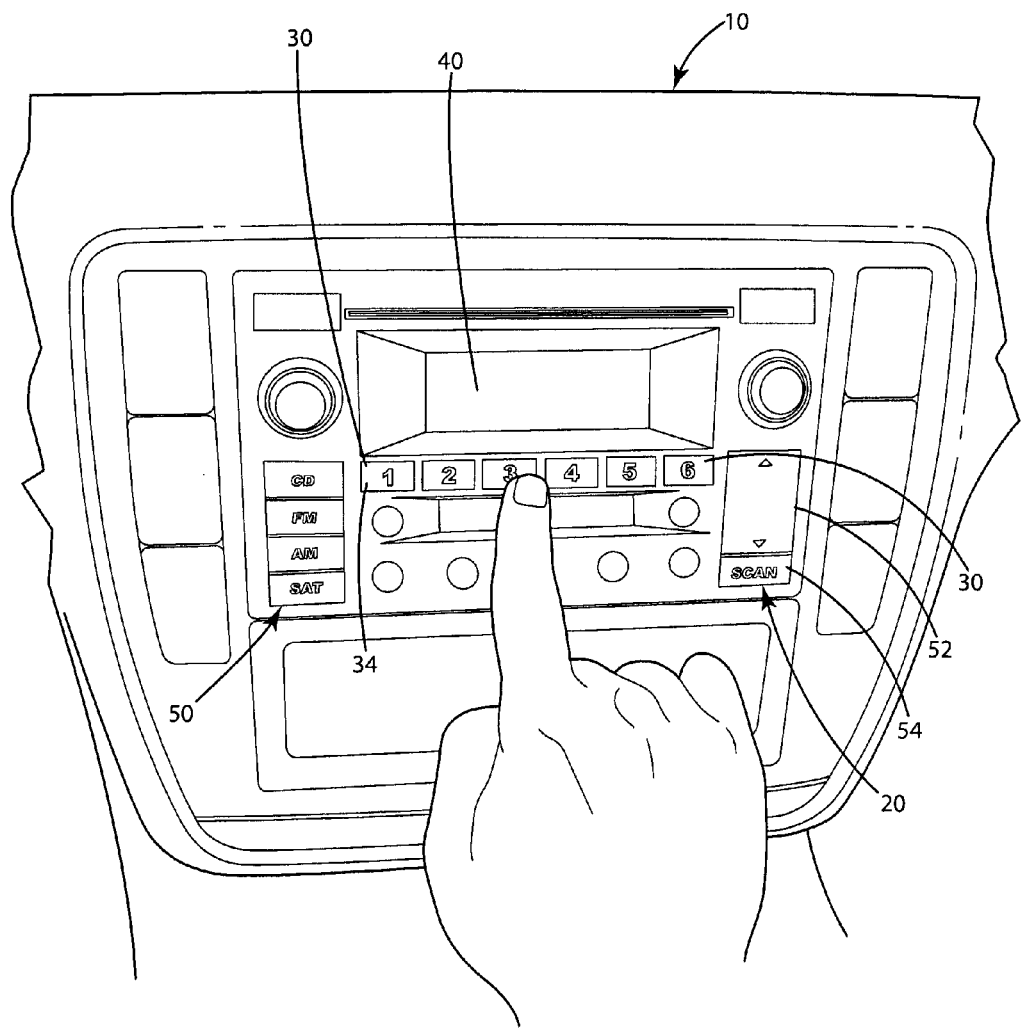
FIG. 1 is a front illustration of an exemplary vehicle entertainment system including various preset buttons.

The present invention is directed to an entertainment system 10 capable of providing visual output to the user of the status of selected channels or frequencies. The present invention is also directed to a method of providing a graphical or visual output to the user regarding the status of selected frequencies associated with preset buttons.

As illustrated in the figures, the entertainment system 10 generally includes an operator interface 20 which in turn includes preset buttons 30, and a display 40. Of course, the system 10 may not include a display, but requires preset buttons and a visual indicator of the correct status of stations. Although, not illustrated in the Figures, the entertainment system 10 generally also includes an antenna, at least one tuner, and preferably two tuners, and a frequency analyzer.

The system 10 may be any entertainment system but as illustrated in the Figures, the present invention is particularly applicable to vehicle entertainment systems. The entertainment system 10 may be any entertainment system configured to receive wireless broadcast signals having entertainment content and providing audio or visual output of the content to the user. For example, a vehicle entertainment system may include inputs from CD players, DVD players, mass storage devices such as Ipods or MP3 players, FM and AM radio frequency bands as well as satellite radio, internet radio, and television signals. The entertainment system 10 may also be as only simple as a radio receiver.

The present invention is particularly applicable in that it provides a system and method that is capable of providing a visual indication to a user that is easily understood regarding favorite stations at selected frequencies or particular frequencies associated with preset buttons or the next adjacent tunable frequencies associated with pushing the seek or scan buttons. Through the use of the visual indicator provided by the system, the user may make an informed decision whether it is desirable to manually change the system 10 from the current frequency to another frequency associated with the preset buttons 30 or the seek/scan buttons 50. The user inputs the desired frequencies associated with each preset button, such that the frequencies are stored in the memory of the entertainment system. These stored frequencies are of particular interest to the operator which allows the system 10 to scan only the frequencies desired by the user, such that the system may be implemented in a low cost and efficient manner by scanning only a limited number of frequencies. For example, the vehicle entertainment system 10 illustrated in FIG. 1 includes only six stored frequency preset buttons as well as two frequencies on each side of the current frequency in the two directions of seek/scan. Therefore, the system 10 may scan as little as eight frequencies to determine the status of the current content being provided on those eight frequencies of importance to the user, and provide a visual indicator related to each of those eight frequencies. Of course, vehicle entertainment systems 10 may be configured to provide multiple stored frequencies with each preset button 30 such as having two FM bands as well as an AM band and even satellite radio channels or other content associated with the preset buttons. The visual output will display only the status of the frequencies associated with the preset button 30. Pre-scanning selected frequencies or other bands or inputs allows the system to almost immediately provide status information on the pre-scanned frequencies or channels associated with the preset buttons. Therefore, upon changing bands or content sources, the user immediately is provided with a visual output of the current status of each frequency associated with a particular preset button, on the different band or input.

Figure 2:
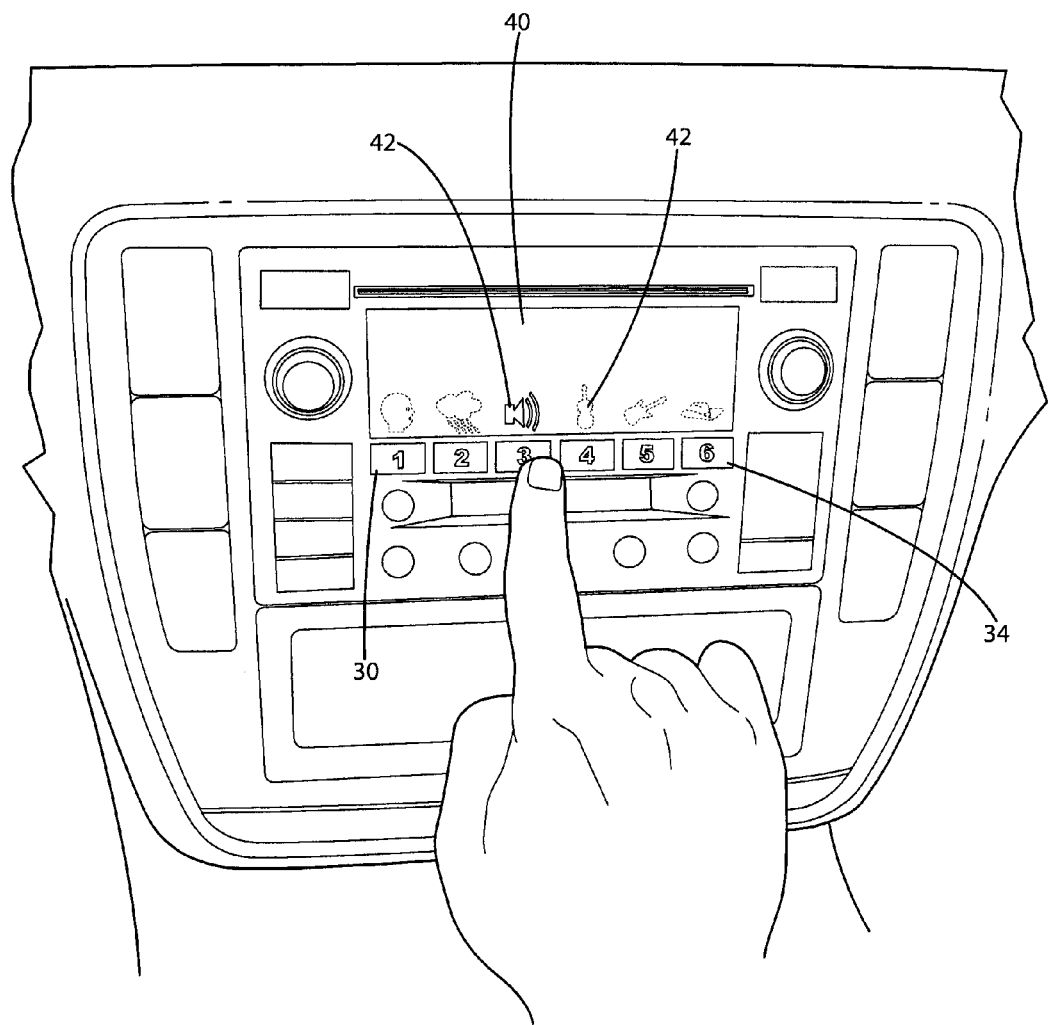
FIG. 2 is a second exemplary entertainment system including preset buttons and an enlarged display.
Figure 3:
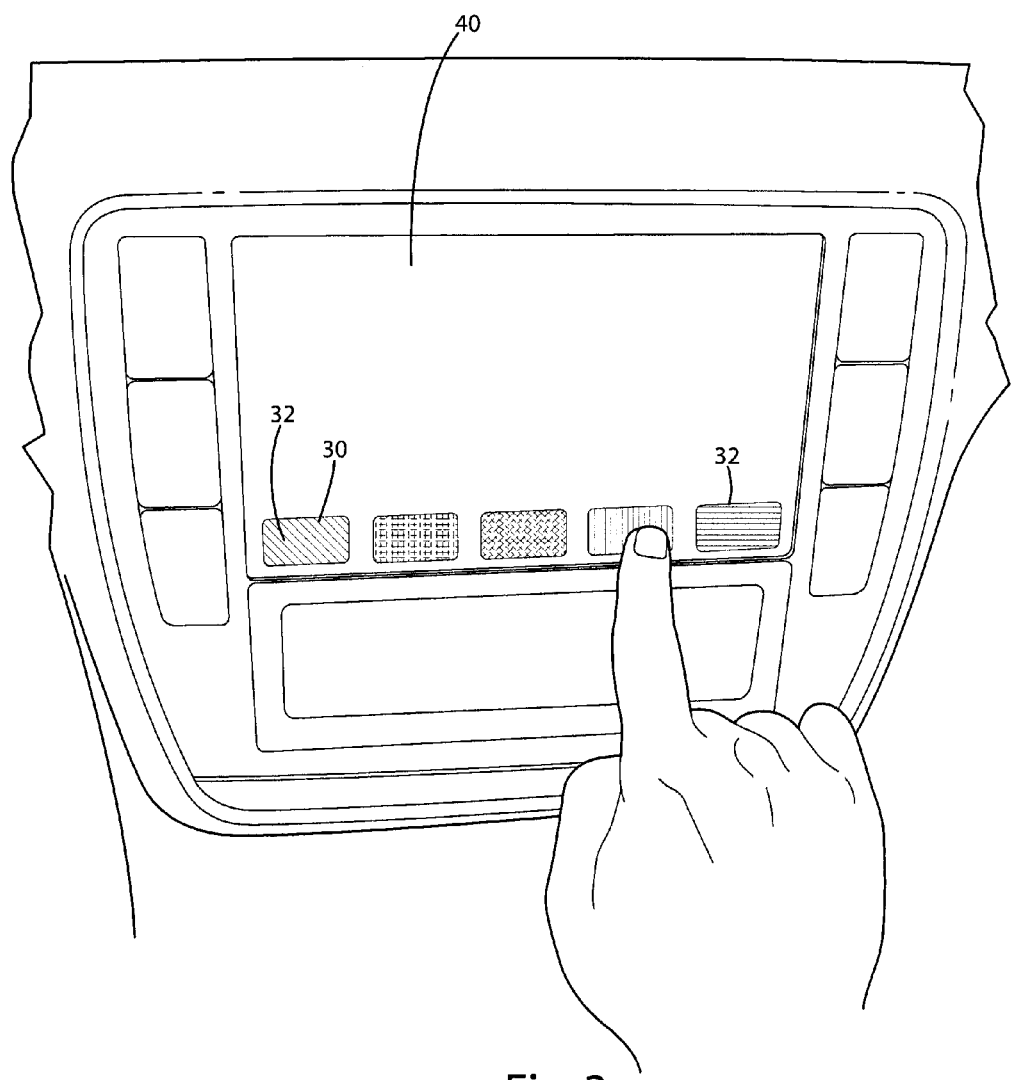
FIG. 3 is a diagrammatic view of a touch screen display of a vehicle entertainment system having soft key preset buttons.

As illustrated in the Figures, the vehicle entertainment system 10 includes the operator interface 20 which may take on any style, configuration or shape as desired, such as the three exemplary but different operator interfaces 20 illustrated in FIGS. 1, 2 and 3. The operator interface 20 includes the preset buttons 30 which may be hard buttons 34 as illustrated in FIG. 1 having translucent portions 36 forming the visible numbers. The preset buttons 30 may also be formed as part of the display 40 illustrated in FIG. 3. In FIG. 3, the preset buttons are soft touch buttons 32 wherein the user would touch the display 40 to provide an input to the vehicle entertainment system 10.

As illustrated in FIG. 1, the input selection buttons 50 are provided to allow the user to select between FM, AM, tape, CD, satellite radio and other items as well as having a scan 52 and seek 54 buttons.

Figure 1A:
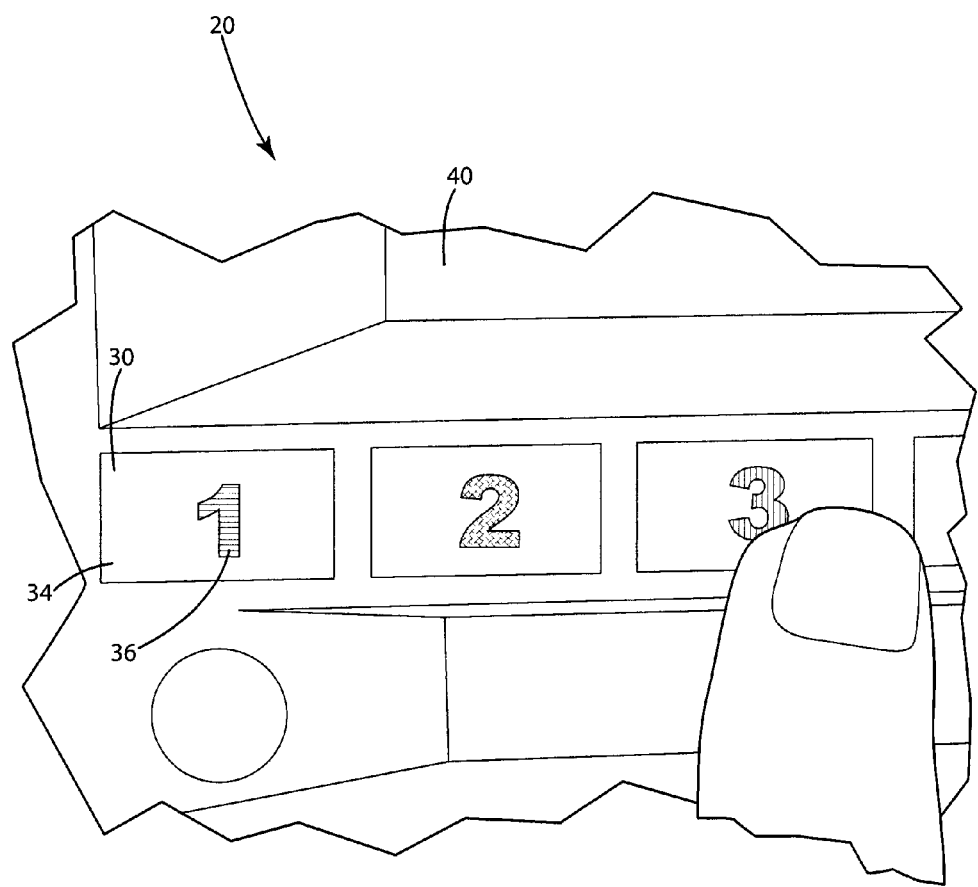
FIG. 1A is an enlargement of selected preset buttons from FIG. 1 showing different colored output of the numbers on the selected preset buttons.

The operator interface illustrated in FIG. 1A is an enlarged version of certain preset buttons 30 and the display 40 in FIG. 1 illustrating the colored output for visual indicators provided by the entertainment system 10 denoting the current or recent status of the stations, frequencies or channels associated with the preset buttons 30. More specifically, a user would store a particular frequency in a preset button 30 to associate that particular frequency with that preset button 30. When the user is listening to audio or watching visual content, the preset buttons 30 associated with selected and stored frequencies on the same content band would illuminate in different colors, providing visual status indicators to the user of the current status of the stored frequency or channel.

As is well known in the art, the preset buttons 30 may include a translucent portion 36 on hard buttons 34. The translucent buttons 36 at night, when the vehicle lights are on or in other instances when the entertainment system 10 is on, illuminates with background lighting in particular to allow a user to easily find the correct preset button 30 and press it in the dark. The present invention uses this illumination with other illumination sources to create particular colors for each preset button thereby to visually indicate the status of the individual selected frequency with each preset button 30. It is important that the illuminated color can change and that the color may be individually selected for each preset button, and individually changed to a different color for each preset button. For example, if the preset button 30 is illuminated with red it may visually indicate that the selected frequency is currently playing a commercial or other content that the frequency analyzer has determined is typically undesirable. If the preset button 30 illuminates in green, it may symbolize music is primarily being played on the frequency associated with that preset button 30. If the frequency button 30 illuminates in blue, it may indicate that talk radio or other talk programs are currently active on the frequency associated with that particular preset button 30. Of course, the above provided colors are just exemplary and any color could be set by the manufacturer or in even in some circumstances customized by the consumer to provide the desired visual indicators. In some circumstances, the system 10 may also provide a neutral color such as white or of course, any other selected color to output when no determination may be made by the frequency analyzer. FIG. 1A with the enlarged preset buttons has been drawn to show exemplary different colors associated with each preset button.

As illustrated further in FIG. 2, a similar system to that in FIG. 1 may use preset buttons 30 that are hard buttons 34 but also display in close proximity to the preset button 30, a graphical symbol 42 above each preset button such that at a quick glance, a user may determine what content is currently playing for each selected frequency for each preset button 30. In some circumstances, it may be easier to provide a graphical output on the display 40 instead of changing colors of the illuminated preset buttons 30. Of course, the graphical symbol 42 may be combined with the different colors as described above to provide increased feedback. The exemplary graphic symbols 42 illustrated in FIG. 2 show a person's head as illustrating talk radio, a music note or other music symbol as illustrating music, a dash for undeterminable content, a dollar sign for commercials, and a cloud with precipitation for weather. Of course, these graphical representations are only exemplary and any other desired graphical illustrations may be associated with particular content. As illustrated in FIG. 2, different musical symbols may be used to illustrate what type of music is being played by the station.

FIG. 3 further illustrates a system 10 including a display 40 that is a touch screen interface with a preset buttons 30 being interactive by touching the display 40. These are soft touch buttons 32. The soft touch buttons 32 may appear as illustrated in FIG. 3 with various colors but also may include, although not illustrated, various graphical illustrations proximate to the button or as part of the button. For example, one of the buttons may show a large treble clef symbolizing music being played on the frequency or channel associated with that preset button.

Figure 4:
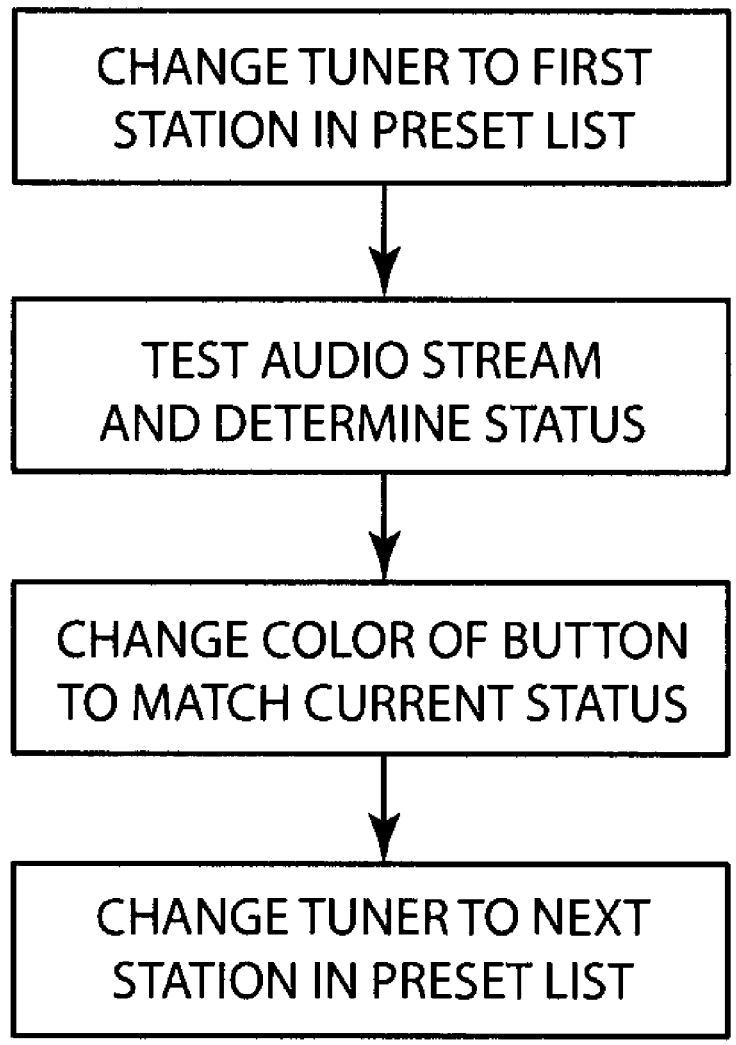
FIG. 4 is a flow chart of a simplified method for determining the status of selected frequencies associated with preset buttons.

The method is generally illustrated in FIG. 4, however, to provide relevant interactive feedback through a visual indicator to the user, the user must first program each desired frequency or channel into the preset button 30 that the user wants scanned and analyzed in the background while listening to other entertainment content such as radio. The user may store a particular frequency or channel for the preset button 30 according to the instructions of the particular system 10. Once a particular frequency or channel is associated with a preset button 10, the system 10 knows that the user is interested in determining the status of content or the type of content being broadcasted through that frequency or channel. As further used herein, the term frequency shall also include channels such as provided with satellite radio, internet radio, or channels as broadcast through digital radio even though different channels may be on the same frequency.

Typically, a user would store in the memory of the system a plurality of frequencies each one being individually associated with an individual preset button 30. With the buttons having an associated frequency, the system using a frequency analyzer would analyze the individual selected frequencies provided by a tuner. While in some instances a tuner may multi-task and provide audio output as well as scan adjacent frequencies, the present invention preferably uses two tuners with the first tuner providing an output signal of the station or frequency that is active with the user, such as an audio output to the user when the entertainment system is turned on and tuned to wireless audio or visual content. For example, entertainment system 10 may be tuned to a particular frequency and then using the tuner provide an audio output to the various speakers as is well known in the art.

The second tuner would be used in addition with the system in the background analyzing the individual selected frequencies with the second tuner. The analyzation of these selected frequencies which are stored in preset buttons occurs in the background without affecting the output provided to the user by the first tuner. Therefore, except for the visual indicator provided to the user, the user is generally not aware of the steps that the entertainment system 10 is taking to provide the visual output or indicator of the status of content other than the currently active content.

As part of the step of analyzing the individual selected frequencies, the frequency analyzer would determine the status of each individual selected frequency. The determined status typically involves the steps of determining whether music content or talk content is being provided. The frequency analyzer could further breakdown the type of content and further determine that the talk content is an actual talk show or other show that is primarily voice content such as a sports radio station or that the talk content is primarily a commercial. Of course, the system may not be able to determine what content is currently being provided and may mark that individual selected frequency as undetermined and may return as soon as possible to perform another analyzation and determination of the status of the content being provided.

Once the status is determined for each individual selected frequency, the system provides a visual indicator or output of the status of each individually selected frequency illustrating the status of the frequencies associated with each preset button. To ensure that the determined status stays relevant to the current content, the system may at regular intervals or in some cases irregular intervals repeat the analyzation and determination of pre-selected frequencies.

As the system does the analyzation and the determination in the background, the system is primarily passive as it only provides a visual indicator of the current status of particular frequencies and does not automatically change the frequency or channel to move the content to a new station or content provider. As such, the user will continue to listen to the current audio output signal provided only by the first tuner until the user manually decides to change the content source such as changed to a different station. Therefore, the system would maintain the audio output of the first tuner until interrupted by the user providing an external input such as pushing the seek/scan button or pressing one of the preset buttons.

The visual indicator may be as simple as changing or illuminating a new colored LED behind one of the preset buttons. For example, with two different colors of LED illumination, the system may easily provide at least three different colors denoting the current status of a particular station.

In certain instances, the system may include an input device for the user to select positive or negative inputs regarding the content. These positive and negative inputs may use various algorithms to fine tune the status visual indicator to the type of content being provided. More specifically, for music, the user may over time indicate multiple preferences regarding whether a music song or style of music is positively rated or negatively rated such as a thumb's up or thumb's down. By inputting various thumb's ups or thumb's downs, the system 10 may learn which type of music style the user likes and such when the visual indicator is the color or graphical illustration related to music, it could have various shades of color, differing colors or different sizes depending on whether or not the system believes that the content would be desirable to the user. Therefore, the system 10 may learn and provide greater customization to the user by providing visual indicators whether or not the user would not only prefer to receive music on a particular channel but that the music is also within the style or type of music enjoyed by the user.

The foregoing discussion discloses and describes an exemplary embodiment of the present invention. One skilled in the art will readily recognize from such discussion, and from the accompanying drawings and claims that various changes, modifications and variations can be made therein without departing from the true spirit and fair scope of the invention as defined by the following claims.

What is claimed is:

1. A vehicle entertainment system capable of receiving a range of wireless frequencies and providing an audio output signal associated with a particular frequency selected from the range of wireless frequencies, said vehicle entertainment system comprising:

an operator interface including a display and a plurality of preset buttons wherein each preset button is associated with a particular stored frequency selected from the range of wireless frequencies;
a first tuner providing the audio output signal associated with the particular frequency selected from the range of wireless frequencies;
a second tuner capable of scanning each of the particular stored frequencies associated with each of said plurality of preset buttons and wherein said second tuner provides an output signal to a frequency analyzer and wherein said frequency analyzer provides a status signal to said operator interface related to the status of at least one of the particular stored frequencies and associated with at least one of the plurality of presets wherein the status is related to the type of content currently being broadcast on said at least one of the particular stored frequencies and wherein said operator interface provides a visual indicator associated with the at least one preset in response to said status signal.

2. The vehicle entertainment system of claim 1 wherein the range of wireless frequencies is selected from one of AM band, FM band, internet radio and satellite radio.

3. The vehicle entertainment system of claim 1 wherein said stored frequency is a channel on satellite radio.

4. The vehicle entertainment system of claim 1 wherein each of said preset buttons includes at least two backlight light sources, and wherein said at least two backlight light sources are said visual indicators.

5. The vehicle entertainment system of claim 4 wherein each of said backlight sources emits a different light color.

6. The vehicle entertainment system of claim 5 wherein said at least two backlight sources include a first colored light source and a second colored light source and wherein said status signal includes a first status signal and a second status signal and wherein said first colored light source illuminates in response to said first signal and said second colored light source in response to said second signal.

7. The vehicle entertainment system of claim 1 wherein said visual indicator is a symbol on said display in proximity to an associated preset button of said preset buttons.

8. The vehicle entertainment system of claim 7 wherein said symbol is a colored output.

9. The vehicle entertainment system of claim 7 wherein said symbol is a graphical symbol on said display.

10. The vehicle entertainment system of claim 9 wherein said graphical symbol is one of a person's head, a music note, a music instrument, a symbol for commercials, and a cloud.

11. The vehicle entertainment system of claim 1 wherein said status signal identifies the type of content currently being broadcast as one of talk content and music content.

12. The vehicle entertainment system of claim 11 wherein the type of content currently being broadcast is talk content and said status signal identifies the talk content is at least one of talk show, sports radio, commercial or undetermined.

13. The vehicle entertainment system of claim 11 wherein the type of content is music and said status signal identifies the type of music currently being broadcast.

14. A method of determining the status of individual selected frequencies, each individual selected frequency being associated with a preset button of an entertainment system, comprising the steps of:
providing an output signal from a first tuner;
analyzing the individual selected frequencies with a second tuner;
determining the current status of content on each of said individual selected frequency analyzed during said step of analyzing the individual selected frequencies;
providing a visual indicator output of the current status of each individual selected frequency determined during said step of determining the status of each individual selected frequency.

15. The method of claim 14 further including the step of repeating said steps of analyzing, determining and providing a visual indicator at predetermined intervals.

16. The method of claim 14 wherein said steps of analyzing, determining and providing a visual indicator are performed while said step of providing an output signal is simultaneously being performed.

17. The method of claim 14 wherein said step of providing an output signal further includes the steps of tuning the first tuner to a particular frequency and maintaining the particular frequency without system interference while said steps of analyzing, determining and providing a visual output are being performed.

18. The method of claim 14 further including the step of maintaining the provided audio output to a particular frequency until receiving a manually inputted instruction to change the particular frequency to a different frequency.

19. The method of claim 14 wherein said step of providing a visual indicator further includes the step of changing the backlight color of a preset button.

20. The method of claim 14 wherein said step of providing a visual indicator includes the step of visibly changing a user interface of the entertainment system proximate to the preset buttons.

21. The method of claim 14 wherein said preset buttons include the seek and scan buttons and wherein the selected frequencies are the adjacent frequency to the frequency to which the first tuner is tuned.

22. The method of claim 21 further including the step of only analyzing individually selected frequencies and the adjacent frequencies to the frequency to which the first tuner is tuned.

23. The method of claim 14 wherein said step of determining the current status includes the step of determining whether music content or talk content is being currently provided.

24. The method of claim 23 wherein the step of determining whether music or talk content is being currently provided further includes the step of determining talk content is being provided and determining the type of talk content.

25. The method of claim 24 wherein the step of determining the type of talk content includes the step of determining at least one of voice content or commercial content.

26. The method of claim 25 wherein said step of determining voice content further includes the step of determining at least one of talk show content, sports radio content.

27. The method of claim 23 wherein the step of determining music or talk content further includes the step of determining music content and further includes the step of determining the type of music content.

* * * * *